(12) United States Patent
Carlson

(10) Patent No.: US 7,310,152 B2
(45) Date of Patent: Dec. 18, 2007

(54) INTERFEROMETER ASSEMBLIES HAVING REDUCED CYCLIC ERRORS AND SYSTEM USING THE INTERFEROMETER ASSEMBLIES

(75) Inventor: Andrew Eric Carlson, Higganum, CT (US)

(73) Assignee: Zygo Corporation, Middlefield, CT (US)

( * ) Notice: Subject to any disclaimer, the term of this patent is extended or adjusted under 35 U.S.C. 154(b) by 270 days.

(21) Appl. No.: 11/071,878

(22) Filed: Mar. 3, 2005

(65) Prior Publication Data

US 2005/0195404 A1    Sep. 8, 2005

Related U.S. Application Data

(60) Provisional application No. 60/550,206, filed on Mar. 3, 2004.

(51) Int. Cl.
*G01B 9/02* (2006.01)
(52) U.S. Cl. ...................................... 356/493
(58) Field of Classification Search ............... 356/491, 356/492, 493, 496, 498, 500
See application file for complete search history.

(56) References Cited

U.S. PATENT DOCUMENTS

| | | | |
|---|---|---|---|
| 4,606,638 A | 8/1986 | Sommargren | |
| 4,684,828 A | 8/1987 | Sommargren | |
| 4,685,803 A | 8/1987 | Sommargren | |
| 4,688,940 A | 8/1987 | Sommargren et al. | |
| 4,693,605 A | 9/1987 | Sommargren | |
| 4,711,573 A | 12/1987 | Wijntjes et al. | |
| 4,717,250 A | 1/1988 | Sommargren | |
| 4,733,967 A | 3/1988 | Sommargren | |
| 4,746,216 A | 5/1988 | Sommargren | |
| 4,752,133 A | 6/1988 | Sommargren | |
| 4,790,651 A | 12/1988 | Brown et al. | |
| 4,802,764 A | 2/1989 | Young et al. | |
| 4,802,765 A | 2/1989 | Young et al. | |
| 4,836,678 A * | 6/1989 | Okaji ......................... 356/492 |
| 4,859,066 A | 8/1989 | Sommargren | |
| 4,881,816 A | 11/1989 | Zanoni | |
| 4,950,078 A | 8/1990 | Sommargren | |
| 5,064,289 A | 11/1991 | Bockman | |

(Continued)

FOREIGN PATENT DOCUMENTS

JP    7-351078    12/1995

(Continued)

OTHER PUBLICATIONS

Bennett, S.J. . "A Double-Passed Michelson Interferometer." Optics Communications, 4:6, pp. 428-430, 1972.

(Continued)

*Primary Examiner*—Michael A. Lyons
(74) *Attorney, Agent, or Firm*—Fish & Richardson P.C.

(57) ABSTRACT

In general, in one aspect, the invention features apparatus that include an interferometer including a main assembly having two laterally displaced polarizing beam splitter interfaces, wherein the interfaces are positioned to receive two spatially separated beams and direct them each to make at least two passes to one or more remote objects. Each interface reflects and transmits each beam at least once, and the interferometer is configured to combine the two beams after they make the at least two passes to the one or more remote objects to produce an output beam including information about an optical path length difference between paths traveled by the two beams.

51 Claims, 9 Drawing Sheets

U.S. PATENT DOCUMENTS

| | | |
|---|---|---|
| 5,114,234 A | 5/1992 | Otsuka et al. |
| 5,133,599 A | 7/1992 | Sommargren |
| 5,187,543 A | 2/1993 | Ebert |
| 5,331,400 A | 7/1994 | Wilkening et al. |
| 5,408,318 A | 4/1995 | Slater |
| 5,663,793 A | 9/1997 | de Groot |
| 5,724,136 A | 3/1998 | Zanoni |
| 5,757,160 A | 5/1998 | Kreuzer |
| 5,764,361 A | 6/1998 | Kato et al. |
| 5,801,832 A | 9/1998 | Van Den Brink |
| 6,008,902 A | 12/1999 | Rinn |
| 6,046,792 A | 4/2000 | Van Der Werf et al. |
| 6,124,931 A | 9/2000 | Hill |
| 6,134,007 A | 10/2000 | Naraki et al. |
| 6,137,574 A | 10/2000 | Hill |
| 6,181,420 B1 | 1/2001 | Badami et al. |
| 6,198,574 B1 | 3/2001 | Hill |
| 6,201,609 B1 | 3/2001 | Hill et al. |
| 6,208,424 B1 | 3/2001 | de Groot |
| 6,219,144 B1 | 4/2001 | Hill |
| 6,236,507 B1 | 5/2001 | Hill et al. |
| 6,246,481 B1 | 6/2001 | Hill |
| 6,252,667 B1 * | 6/2001 | Hill et al. ................ 356/487 |
| 6,252,668 B1 | 6/2001 | Hill |
| 6,271,923 B1 | 8/2001 | Hill |
| 6,304,318 B1 | 10/2001 | Matsumoto |
| 6,327,039 B1 | 12/2001 | de Groot et al. |
| 6,330,065 B1 | 12/2001 | Hill |
| 6,384,899 B1 * | 5/2002 | den Boef ................ 355/69 |
| 6,407,816 B1 | 6/2002 | de Groot et al. |
| 6,417,927 B2 | 7/2002 | de Groot |
| 6,512,588 B1 | 1/2003 | Hill |
| 6,525,825 B2 | 2/2003 | de Groot et al. |
| 6,525,826 B2 | 2/2003 | de Groot et al. |
| 6,529,279 B2 | 3/2003 | de Groot et al. |
| 6,541,759 B1 | 4/2003 | Hill |
| 6,552,804 B2 | 4/2003 | Hill |
| 6,650,419 B2 | 11/2003 | Hill |
| 6,727,992 B2 | 4/2004 | Hill |
| 6,738,143 B2 | 5/2004 | Chu |
| 6,747,744 B2 | 6/2004 | Hill |
| 6,757,066 B2 | 6/2004 | Hill |
| 6,762,845 B2 | 7/2004 | Hill |
| 6,778,280 B2 | 8/2004 | De Groot et al. |
| 6,791,693 B2 | 9/2004 | Hill |
| 6,795,197 B2 | 9/2004 | Hill |
| 6,806,961 B2 | 10/2004 | Hill |
| 6,806,962 B2 | 10/2004 | Hill |
| 6,817,434 B1 | 11/2004 | Sweet |
| 6,819,434 B2 | 11/2004 | Hill |
| 6,836,335 B2 | 12/2004 | Hill |
| 6,839,141 B2 | 1/2005 | Hill |
| 6,867,867 B2 | 3/2005 | Hill |
| 6,891,624 B2 | 5/2005 | Hill |
| 6,912,054 B2 | 6/2005 | Hill |
| 7,057,739 B2 | 6/2006 | Hill |
| 2001/0035959 A1 | 11/2001 | Hill |
| 2002/0089671 A1 | 7/2002 | Hill |
| 2003/0090675 A1 | 5/2003 | Fujiwara |
| 2004/0046965 A1 | 3/2004 | Hill |
| 2005/0134862 A1 | 6/2005 | Hill |

FOREIGN PATENT DOCUMENTS

| | | |
|---|---|---|
| JP | 8-117083 | 4/1996 |
| JP | 9-280822 | 10/1997 |

OTHER PUBLICATIONS

Wu et al. "Analytical modeling of the periodic nonlinearity in heterodyne interferometry." Applied Optics, 37:28, pp. 6696-6700, 1998.

Hines et al. Sub-Nonometer Laser Metrology—Some Techniques and Models. ESO Conference on High-Resolution Imaging by Interferometry II, pp. 1195-1204, 1991.

Bobroff, Norman. "Recent advances in displacement measuring interferometry." Meas. Sci. Technol. 4, pp. 907-926, 1993.

Oka et al. "Polarization heterodyne interferometry using another local oscillator beam." Optics Communications, 92, pp. 1-5, 1992.

Mauer, Paul. "Phase Compensation of Total Internal Reflection." J. Opt. Soc. Am., 56:9, pp. 1219-1221, 1966/.

Player, M.A. "Polarization properties of a cube-corner reflector." J. Mod. Opt., 35:11, pp. 1813-1820, 1988.

Badami et al. "Investigation of NonLinearity in High Accuracy Heterodyne Laser Interferometry." American Society for Precision Engineering, 1997 Proceedings, 16, pp. 153-156, 1997.

Bobroff, Norman. "Residual errors in laser interferometry from air turbulence and nonlinearity." Applied Optics, 26:13, pp. 2676-2686, 1987.

* cited by examiner

US 7,310,152 B2

INTERFEROMETER ASSEMBLIES HAVING REDUCED CYCLIC ERRORS AND SYSTEM USING THE INTERFEROMETER ASSEMBLIES

CROSS-REFERENCE TO RELATED APPLICATIONS

This application claims priority under 35 USC § 119 to Provisional Patent Application No. 60/550,206, entitled "DIFFERENTIAL PLANE MIRROR INTERFEROMETER WITH REDUCED CYCLIC ERRORS," filed on Mar. 3, 2004, the entire contents of which are hereby incorporated by reference.

BACKGROUND

This invention relates to interferometers, e.g., displacement measuring and dispersion interferometers that measure angular and linear displacements of a measurement object such as a mask stage or a wafer stage in a lithography scanner or stepper system, and also interferometers that monitor wavelength and determine intrinsic properties of gases (e.g., the refractive index or changes in refractive index of a gas).

Displacement measuring interferometers monitor changes in the position of a measurement object relative to a reference object based on an optical interference signal. The interferometer generates the optical interference signal by overlapping and interfering a measurement beam reflected from the measurement object with a reference beam reflected from the reference object.

In many applications, the measurement and reference beams have orthogonal polarizations and different frequencies. The different frequencies can be produced, for example, by laser Zeeman splitting, by acousto-optical modulation, or internal to the laser using birefringent elements or the like. The orthogonal polarizations allow a polarizing beam-splitter to direct the measurement and reference beams to the measurement and reference objects, respectively, and combine the reflected measurement and reference beams to form overlapping exit measurement and reference beams. The overlapping exit beams form an output beam that subsequently passes through a polarizer. The polarizer mixes polarizations of the exit measurement and reference beams to form a mixed beam. Components of the exit measurement and reference beams in the mixed beam interfere with one another so that the intensity of the mixed beam varies with the relative phase of the exit measurement and reference beams. A detector measures the time-dependent intensity of the mixed beam and generates an electrical interference signal proportional to that intensity. Because the measurement and reference beams have different frequencies, the electrical interference signal includes a "heterodyne" signal having a beat frequency equal to the difference between the frequencies of the exit measurement and reference beams. If the lengths of the measurement and reference paths are changing relative to one another, e.g., by translating a stage that includes the measurement object, the measured beat frequency includes a Doppler shift equal to $2vnp/\lambda$, where $v$ is the relative speed of the measurement and reference objects, $\lambda$ is the wavelength of the measurement and reference beams, $n$ is the refractive index of the medium through which the light beams travel, e.g., air or vacuum, and $p$ is the number of passes to the reference and measurement objects. Changes in the relative position of the measurement object correspond to changes in the phase of the measured interference signal, with a $2\pi$ phase change substantially equal to a distance change in L of $\lambda/(np)$, where L is a round-trip distance change, e.g., the change in distance to and from a stage that includes the measurement object.

Unfortunately, this equality is not always exact. Many interferometers include non-linearities such as what are known as "cyclic errors." The cyclic errors can be expressed as contributions to the phase and/or the intensity of the measured interference signal and have a sinusoidal dependence on phase changes associated with changes in optical path length pnL and/or on phase changes associated with other parameters. For example, there is first harmonic cyclic error in phase that has a sinusoidal dependence on $(2\pi pnL)/\lambda$ and there is second harmonic cyclic error in phase that has a sinusoidal dependence on $2(2\pi pnL)/\lambda$. Higher harmonic and fractional cyclic errors may also be present.

Cyclic errors can be produced by "beam mixing," in which a portion of an input beam that nominally forms the reference beam propagates along the measurement path and/or a portion of an input beam that nominally forms the measurement beam propagates along the reference path. Such beam mixing can be caused by misalignment of interferometer with respect to polarization states of input beam, birefringence in the optical components of the interferometer, and other imperfections in the interferometer components, e.g., imperfections in a polarizing beam-splitter used to direct orthogonally polarized input beams along respective reference and measurement paths. Because of beam mixing and the resulting cyclic errors, there is not a strictly linear relation between changes in the phase of the measured interference signal and the relative optical path length pnL between the reference and measurement paths. If not compensated, cyclic errors caused by beam mixing can limit the accuracy of distance changes measured by an interferometer. Cyclic errors can also be produced by imperfections in transmissive surfaces that produce undesired multiple reflections within the interferometer and imperfections in components such as retroreflectors and/or phase retardation plates that produce undesired ellipticities and undesired rotations of planes of polarization in beams in the interferometer. For a general reference on the theoretical causes of cyclic errors, see, for example, C. W. Wu and R. D. Deslattes, "Analytical modelling of the periodic nonlinearity in heterodyne interferometry," *Applied Optics*, 37, 6696-6700, 1998.

In dispersion measuring applications, optical path length measurements are made at multiple wavelengths, e.g., 532 nm and 1064 nm, and are used to measure dispersion of a gas in the measurement path of the distance measuring interferometer. The dispersion measurement can be used to convert the optical path length measured by a distance measuring interferometer into a physical length. Such a conversion can be important since changes in the measured optical path length can be caused by gas turbulence and/or by a change in the average density of the gas in the measurement arm even though the physical distance to the measurement object is unchanged. In addition to the extrinsic dispersion measurement, the conversion of the optical path length to a physical length requires knowledge of an intrinsic value of the gas. The factor $\Gamma$ is a suitable intrinsic value and is the reciprocal dispersive power of the gas for the wavelengths used in the dispersion interferometry. The factor $\Gamma$ can be measured separately or based on literature values. Cyclic errors in the interferometer also contribute to dispersion measurements and measurements of the factor $\Gamma$. In addition, cyclic errors can degrade interferometric measurements used to measure and/or monitor the wavelength of a beam.

SUMMARY

In general, in one aspect, the invention features apparatus that include an interferometer including a main assembly having two laterally displaced polarizing beam splitter interfaces, wherein the interfaces are positioned to receive two spatially separated beams and direct them each to make at least two passes to one or more remote objects. Each interface reflects and transmits each beam at least once, and the interferometer is configured to combine the two beams after they make the at least two passes to the one or more remote objects to produce an output beam including information about an optical path length difference between paths traveled by the two beams.

In general, in another aspect, the invention features interferometers that includes an input assembly comprising two laterally displaced polarizing beam splitter interfaces, and a main assembly including at least one polarizing beam splitter interface, wherein the interfaces in the input assembly are positioned to derive two spatially separated beams from an input beam, the main assembly directs the spatially separated beams each to make at least two passes to one or more remote objects, and the input assembly combines the two beams after they make the at least two passes to the one or more remote objects to produce an output beam comprising information about an optical path length difference between paths traveled the two beams.

In general, in another aspect, the invention features apparatus that include an interferometer assembly including an output surface, the interferometer assembly being configured to direct two spatially separated beams to make at least two passes to one or more remote objects, wherein the spatially separated beams intersect the output surface at least once on each pass to the one or more remote objects and a surface normal of the output surface at each intersection is non-parallel with the respective beam path, and the interferometer assembly is configured to combine the two beams after they make the at least two passes to the one or more remote objects to produce an output beam including information about an optical path length difference between paths traveled by the two beams.

Embodiments of the apparatus and/or interferometers can include one or more of the following features. The apparatus can include an input assembly configured to derive the spatially separated beams from an input beam and to direct the spatially separated beams towards the main assembly. The input assembly can be configured so that the spatially separated beams have orthogonal polarizations when exiting the input assembly. The apparatus can include a wave plate between the input assembly and the main assembly, the wave plate being configured to rotate the polarization of one of the spatially separated beams as it travels between the input assembly and the main assembly. The wave plate can be a polymeric wave plate.

An output surface of the input assembly can be optically coupled to an input surface of the main assembly. The input assembly can be configured to direct the two beams towards the main assembly along parallel paths. The input assembly can include two laterally displaced polarizing beam splitter interfaces. The two laterally displaced polarizing beam splitter interfaces of the input assembly can be parallel. The two laterally displaced polarizing beam splitter interfaces of the input assembly can be non-parallel to the two laterally displaced polarizing beam splitter interfaces of the main assembly.

The interferometers can be configured so that the two spatially separated beams have the same polarization when they are received by the main assembly. The main assembly can be configured to direct the spatially separated beams to make at least two passes along parallel paths to the one or more remote objects. The apparatus can include a retroreflector configured to direct the spatially separated beams back towards the main assembly after each beam makes its first pass to the one or more remote objects. The interferometers can be configured so that each of the spatially separated beams makes at least two passes to different locations on the one or more remote objects. The laterally displaced polarizing beam splitter interfaces can be parallel. The main assembly can be monolithic. The apparatus can include an output surface configured so that the spatially separated beams intersect the output surface at least once and a surface normal of the output surface at each intersection is non-parallel with the respective beam path. An angle between each surface normal and the respective beam path can be about 0.1° or more. An angle between each surface normal and the respective beam path can be about 10° or less. The output assembly comprises a wedge. The apparatus can include a quarter wave plate positioned between the main assembly and the output assembly. The quarter wave plate can be a polymeric quarter wave plate. The output assembly can be optically coupled to the main assembly.

The apparatus can include a detector positioned to receive the output beam. The apparatus, can include a source configured to provide an input beam from which the interferometer derives the spatially separated beams. The one or more remote objects can include of a reflecting element. The reflecting element can be a plane mirror or a retroreflector.

In another aspect, the invention features a refractometer including an apparatus as described above.

In general, in a further aspect, the invention features methods that include using an interferometer to direct two spatially separated beams to each make at least two passes to one or more remote objects, wherein the interferometer includes two laterally displaced polarizing beam splitter interfaces positioned to receive the two beams and each interface reflects and transmits each beam at least once, and combining the two beams after they make the at least two passes to the one or more remote objects to produce an output beam comprising information about an optical path length difference between the two beams.

In another aspect, the invention features lithography systems for use in fabricating integrated circuits on a wafer. The systems include a stage for supporting the wafer, an illumination system for imaging spatially patterned radiation onto the wafer, a positioning system for adjusting the position of the stage relative to the imaged radiation, and an interferometry system including an apparatus described above, the interferometry system being configured to monitor the position of the wafer relative to the imaged radiation.

In another aspect, the invention features lithography systems for use in fabricating integrated circuits on a wafer. The systems include a stage for supporting the wafer, and an illumination system including a radiation source, a mask, a positioning system, a lens assembly, and an interferometry system including an apparatus described above, wherein during operation the source directs radiation through the mask to produce spatially patterned radiation, the positioning system adjusts the position of the mask relative to the radiation from the source, the lens assembly images the spatially patterned radiation onto the wafer, and the interferometry system monitors the position of the mask relative to the radiation from the source.

In another aspect, the invention features beam writing systems for use in fabricating a lithography mask. The systems include a source providing a write beam to pattern a substrate, a stage supporting the substrate, a beam directing assembly for delivering the write beam to the substrate, a positioning system for positioning the stage and beam directing assembly relative one another, and an interferometry system including an apparatus described above, the interferometry system being configured to monitor the position of the stage relative to the beam directing assembly.

In general, in another aspect, the invention features lithography methods for use in fabricating integrated circuits on a wafer. The methods include supporting the wafer on a moveable stage, imaging spatially patterned radiation onto the wafer, adjusting the position of the stage, and monitoring the position of the stage using an interferometry system including an apparatus described above.

In another aspect, the invention features lithography methods for use in the fabrication of integrated circuits including directing input radiation through a mask to produce spatially patterned radiation, positioning the mask relative to the input radiation, monitoring the position of the mask relative to the input radiation using an interferometry system including an apparatus described above, and imaging the spatially patterned radiation onto a wafer.

In another aspect, the invention features lithography methods for fabricating integrated circuits on a wafer including positioning a first component of a lithography system relative to a second component of a lithography system to expose the wafer to spatially patterned radiation, and monitoring the position of the first component relative to the second component using an interferometry system including an apparatus described above.

In another aspect, the invention features methods for fabricating integrated circuits, the methods including a lithography method described above.

In another aspect, the invention features methods for fabricating a lithography mask including directing a write beam to a substrate to pattern the substrate, positioning the substrate relative to the write beam, and monitoring the position of the substrate relative to the write beam using an interferometry system including an apparatus described above.

Embodiments include differential plane mirror interferometers (DPMIs) that provide measurements having reduced cyclic errors. Cyclic errors can be reduced by reducing the number of air/glass interfaces in a DPMI assembly, thereby reducing the intensity of spurious reflections from each interface that can contribute to cyclic errors. The number of air/glass interfaces can be reduced by providing a monolithic interferometer assembly. Monolithic assemblies can also provide mechanically stable structures compared to assemblies with discrete components. Furthermore, monolithic assemblies be smaller than assemblies formed from discrete components and can reduce the number of mechanical support components (e.g., mounts and fasteners) required to fix the optical components of an assembly together. A reduced number of components can also reduce the cost of an interferometer assembly.

The effect of spurious reflections from air/glass interfaces can also be reduced by providing interfacial surfaces that have non-orthogonal orientations relative to the path of beams that traverse the surfaces. Such constructions can be achieved using wedges in interferometers assemblies. Embodiments also include DPMIs that have output surfaces oriented non-normal to the path of measurement beams. For example, in some embodiments, interferometer assemblies can include a wedge positioned between the main interferometer assembly and the measurement object. The wedge can be optically coupled to the main assembly.

Cyclic errors can also be reduced by reducing the amount of "leaked" polarization in the components of an output beam. An ideal interferometer using a polarizing beam splitter (PBS) would split an input beam into two orthogonally polarized components where each component would be 100% polarized. In reality, PBSs used to split an input beam into orthogonal linearly polarized beams are not perfect polarizers, and the beams exiting the polarizers include a small amount of "leaked" polarization orthogonal to the desired polarization state. However, the extent to which leaked polarization reaches a detector in an interferometry system can be reduced by providing additional polarizing beam splitters in the path of each beam. The effect of each additional pass of a beam through a PBS and/or each additional pass of a beam through a PBS reduces the amount of leaked polarization in the output beam, reducing associated cyclic errors.

In certain embodiments, errors in interferometer measurements due to wavefront distortions from reflections at facet edges and/or vertices of optical components can be reduced. For example, by replacing a single PBS interface with two laterally displaced PBS interfaces in the main assembly of an interferometer provides flexibility to select a retroreflector sufficiently large so that the beams reflected by the retroreflector reflect from facets rather than facet edges for a range of orientations of a measurement object.

DPMIs described herein can be used in refractometers, improving their measurement accuracy. Refractometers can be used in displacement measuring interferometers to provide accurate displacement measurements. Alternatively, or additionally, DPMIs described herein can be used in conjunction with a column reference to monitor variations in the relative position between the column reference and another measurement object located remote from the interferometer. Furthermore, the interferometry systems and methods described herein can be used to provide accurate metrology and positioning measurements in microlithography and beam-writing systems.

Beams, beam paths, interfaces, and/or axes referred to as being parallel or nominally parallel may deviate from being perfectly parallel to the extent that the effect of the deviation on a measurement is negligible (e.g., less than the required measurement accuracy by an order of magnitude or more) or otherwise compensated.

Other features, objects, and advantages of the invention will be apparent from the following detailed description and drawings, and from the claims.

DESCRIPTION OF DRAWINGS

Like reference symbols in the various drawings indicate like elements.

DETAILED DESCRIPTION

Figure 1:
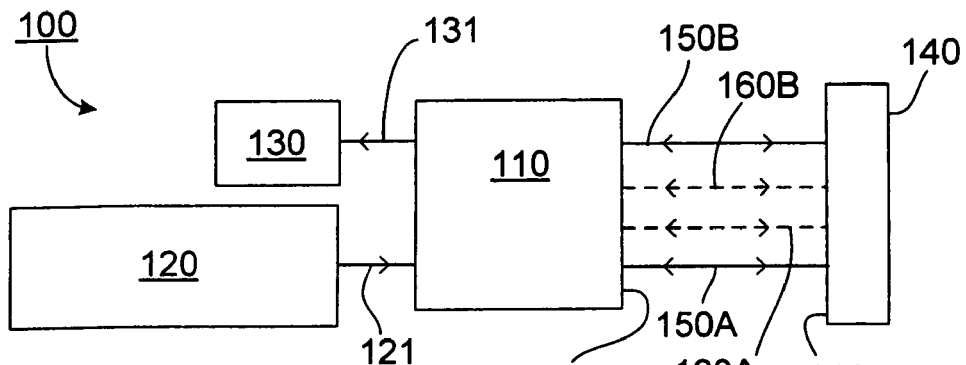
FIG. 1 is a schematic diagram of an interferometry system that includes a differential plane mirror interferometer (DPMI).

Referring to FIG. 1, an interferometry system 100 includes a DPMI 110, a source 120, and a detector 130. The source directs an input beam 121 to DPMI 110, which derives two beams from input beam 121 and directs the two beams out of DPMI 110 through output surface 111 to reflect from a surface 141 of a plane mirror 140 that is remote from DPMI 110. Each beam makes a double pass to mirror 140, each time along a different path. As depicted in FIG. 1, a first of the two beams makes a first pass 150A and a second pass 150B to mirror. The second beam makes a first pass 160A and a second pass 160B to mirror 140. After the beams have made their passes to mirror 140, DPMI 110 overlaps the beams to form an output beam 131, which is detected at a detector 130. Output beam 131 includes an interferometric phase related to the optical path length difference between the first and second beams.

Figure 2A:
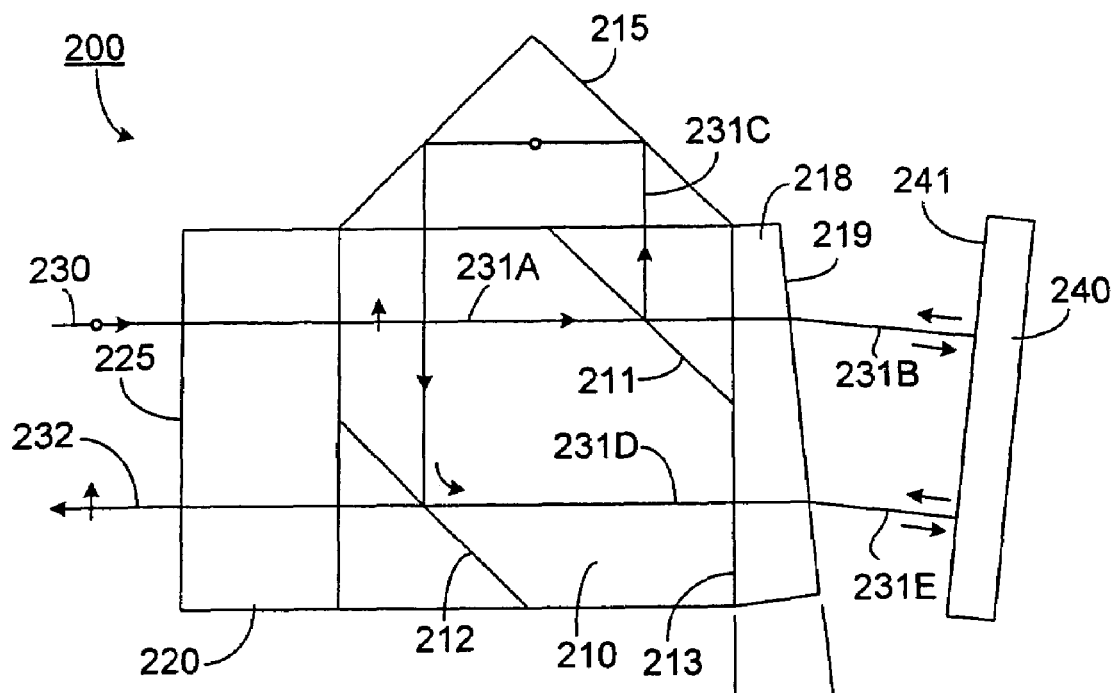
FIG. 2A is a plan view of an embodiment of a DPMI including the path of an input beam component being vertically polarized.
Figure 2B:
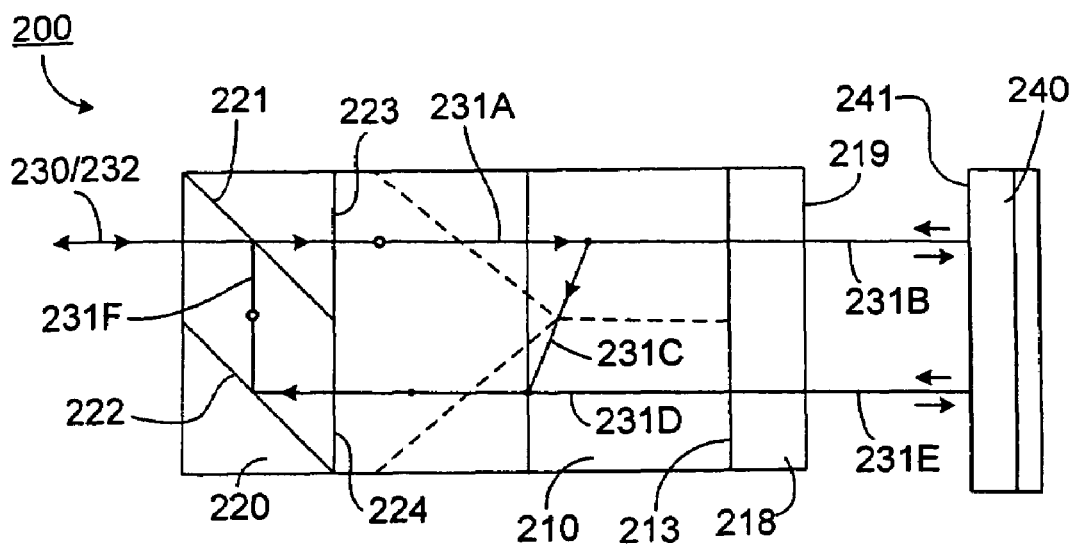
FIG. 2B is a side view of the DPMI shown in FIG. 2A including the path of an input beam component being vertically polarized.
Figure 3A:
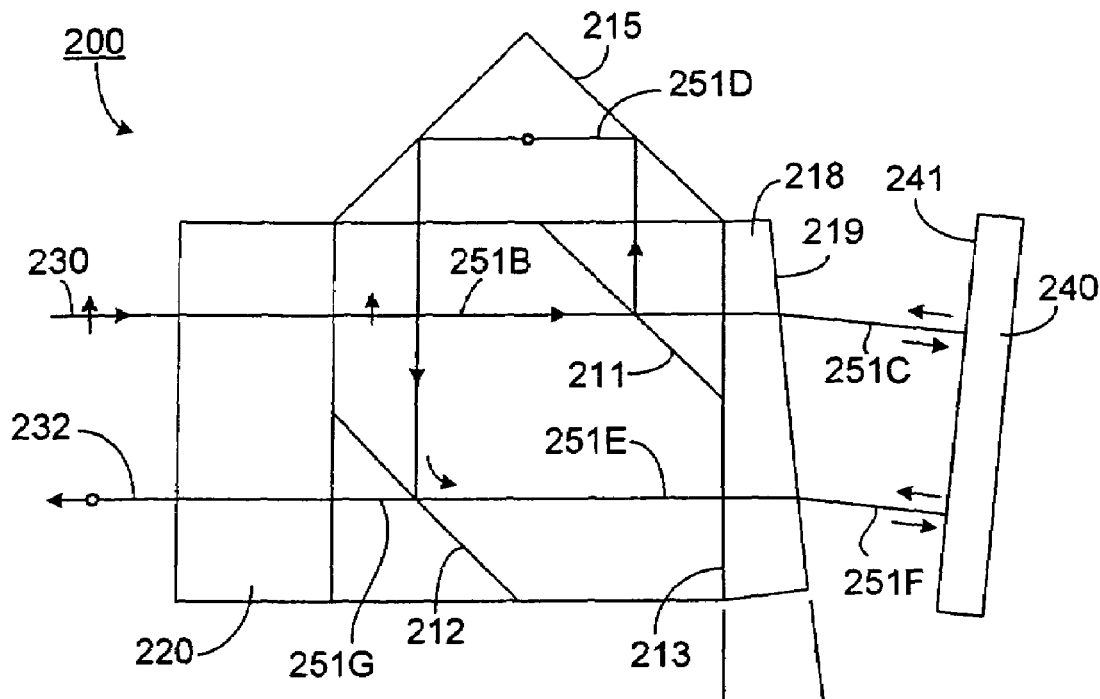
FIG. 3A is a plan view of the DPMI shown in FIG. 2A including the path of an input beam component being horizontally polarized.
Figure 3B:
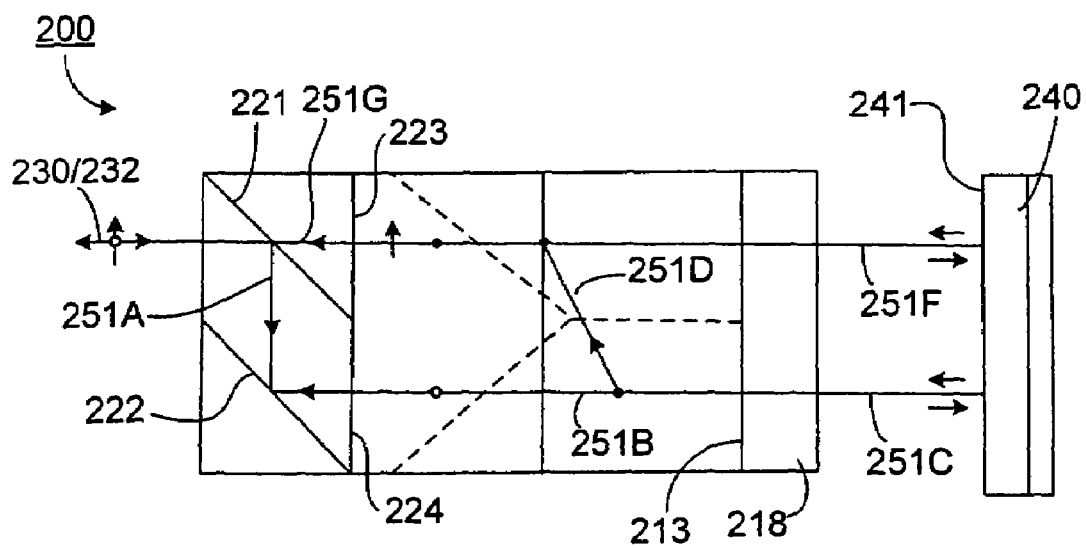
FIG. 3B is a side view of the DPMI shown in FIG. 2A including the path of an input beam component being horizontally polarized.
Figure 4A:
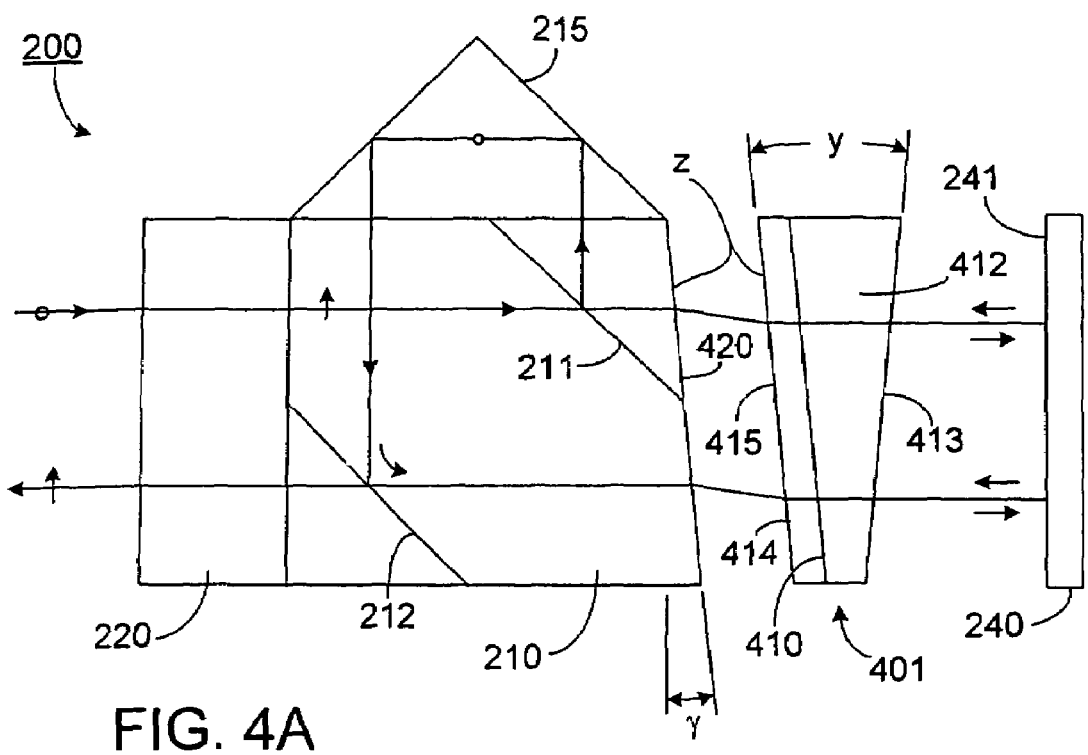
FIG. 4A is a plan view of another embodiment of a DPMI including the path of an input beam component being vertically polarized.
Figure 4B:
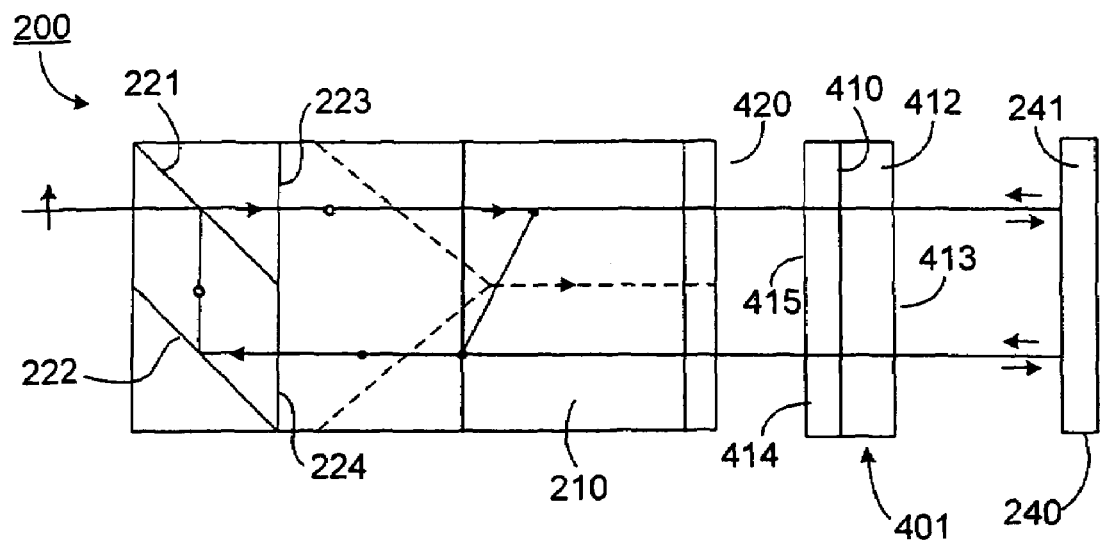
FIG. 4B is a side view of the DPMI shown in FIG. 4A including the path of an input beam component being vertically polarized.
Figure 5A:
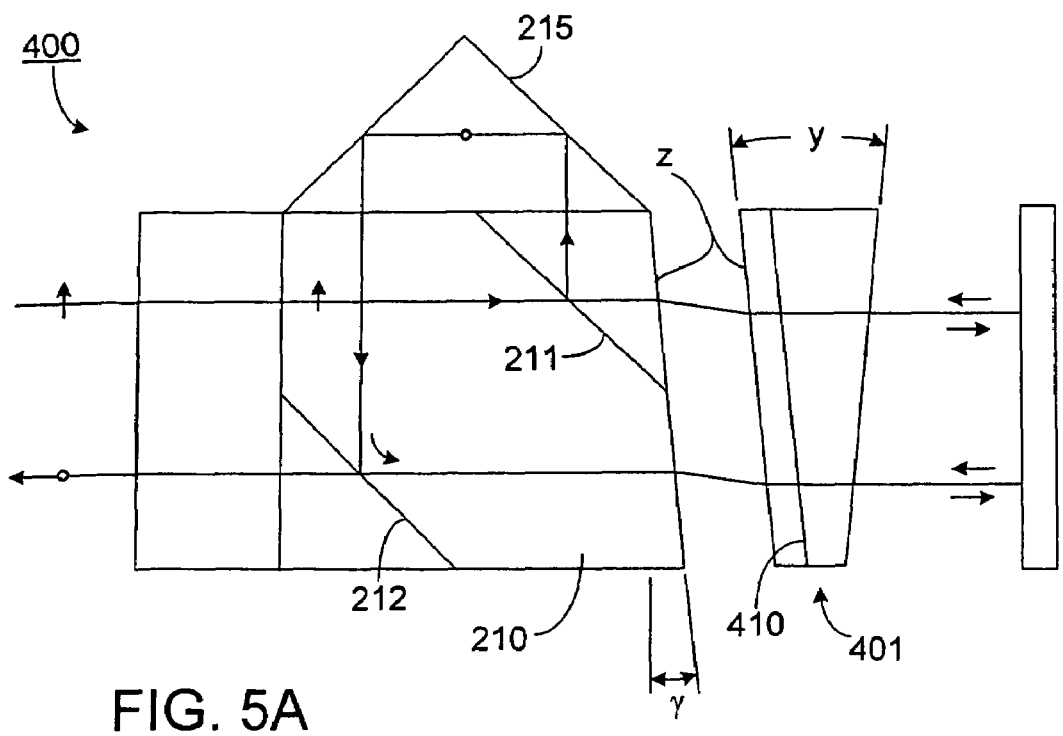
FIG. 5A is a plan view of the DPMI shown in FIG. 4A including the path of an input beam component being horizontally polarized.
Figure 5B:
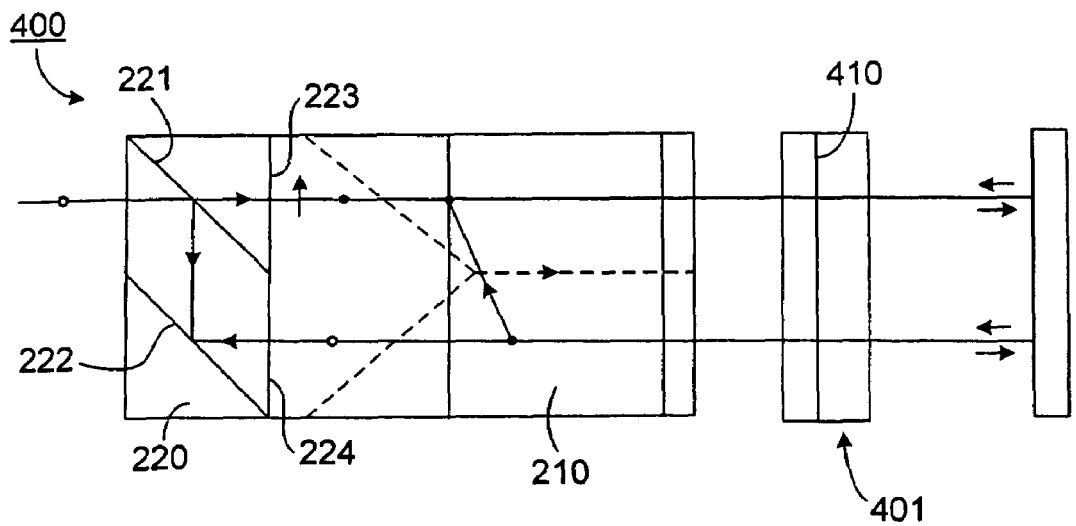
FIG. 5B is a side view of the DPMI shown in FIG. 4A including the path of an input beam component being horizontally polarized.

FIGS. 2A, 2B, 3A, and 3B show an example of a DPMI, DPMI 200. FIGS. 2A and 2B show a plan and side view of interferometer 200, respectively, for the path of a vertically polarized input beam 230 (vertical refers to the direction orthogonal to the plane of the page for FIGS. 2A and 3A). FIGS. 3A and 3B show the same views as FIGS. 2A and 2B, respectively, but show the path of a horizontally polarized input beam 250. For a heterodyne detection scheme, the beams paths in FIGS. 2A and 2B are traced by a different frequency beam relative to the beams paths shown in FIGS. 3A and 3B.

During operation, DPMI 200 directs splits an input beam into its vertically and horizontally polarized component beams, and directs both component beams along different paths to reflect from a surface 241 of a plane mirror 240 twice, before overlapping the component beams to form an output beam. A description of the components of DPMI 200 and the path of each beam through DPMI follows.

Interferometer 200 includes an input assembly 220 and a main assembly 210. Input assembly 220 includes two polarizing beam splitter (PBS) interfaces, interface 222 and interface 221. These interfaces are offset laterally and are oriented parallel to each other. A half wave plate (e.g., a polymeric half wave plate) 223 is positioned adjacent interface 221, between input assembly 220 and main assembly 210 half wave plate 223 does not extend adjacent to interface 222. Main assembly 210 includes two PBS interfaces 211 and 212. Interfaces 211 and 212 are also offset laterally and oriented parallel to each other. Interfaces 211 and 212 are non-parallel with interfaces 221 and 222. Main assembly 215 also includes a corner cube retroreflector 215, and a wedge 218 having a wedge angle, x. An output surface 219 of wedge 218 is positioned facing plane mirror 140.

During operation, orthogonally polarized input beam components directed along path 230 are incident on input assembly 220 adjacent interface 221. Interface 221 the orthogonally polarized components along different paths, transmitting the vertically polarized component towards main assembly 210 along path 231A and reflecting the horizontally polarized component towards interface 222 along path 251A.

Referring specifically to FIGS. 2A and 2B, wave plate 223 rotates the vertically polarized component propagating along path 231A by 90°. Interface 211 transmits this beam 231A, which exits DPMI 200 through output surface 219 along path 231B and reflects from surface 241 of mirror 240. The double pass of the beam through quarter wave plate 213 rotates the polarization the beam by 90°, so when the beam returns to interface 211 it is now polarized vertically and is reflected by this interface along path 231C. The beam is reflected from interface 211 towards retroreflector 215, which in turn directs the beam towards interface 212. Note that interface 211 and the reflecting surfaces of retroreflector 215 are oriented to direct the beam to a horizontal plane below the plane defined by the input and output beam components 230 and 232. Furthermore, interface 212 is configured to reflect vertically polarized light, and reflects the beam back towards mirror 240 along path 231D. The beam exits DPMI 200 along path 231E, reflects from mirror 240, and re-enters the DMPI along the beam path 231D. Note that path 231E is parallel to path 231B. Once the beam re-enters the main assembly, it is now polarized horizontally, having been twice transmitted by quarter wave plate 213. With this polarization, the beam is transmitted by interface 212 and re-enters input assembly 220. The horizontally polarized beam is reflected from interface 222 along path 231F towards interface 221. The beam exits input assembly polarized horizontally along path 232.

Referring now to FIGS. 3A and 3B, the horizontally polarized component of the input beam is reflected by interface 221 along path 251A towards interface 222. This beam reflects from interface 222 and enters main assembly 210 along path 251B. A spacer 224 adjacent interface 222 transmits the beam without rotating its polarization state, so the beam remains horizontally polarized when it enters main assembly 210. The spacer can be an optically isotropic component having the same thickness as half wave plate 223. Alternatively, spacer 224 can be a half wave plate with its principle axis oriented vertically or horizontally. Interface 211 transmits the beam, which exits DPMI 200 through output surface 219 and propagates along path 251C to reflect from mirror 240. The reflected beam reenters DPMI 200 along the same path, and reflects from intsurface 211 having had its polarization state rotated through 90° due to the double pass through quarter wave plate 213. Interface 211 directs the beam along path 251D towards interface 212. Interface 212 directs the beam along path 251E, back in the horizontal plane defined by beam paths 230 and 232. The beam then exits DPMI 200 through output surface 219 on its second pass to mirror 240 along path 251F. Upon reflection from mirror 240, the beam reenters DPMI 200 again having had its polarization state rotated through 90° by the double pass through quarter wave plate 213. Now polarized in the vertical direction, the beam is transmitted by PBS interface 212, travels along path 251G to PBS interface 221 and exits DPMI 200 along path 232 where it overlaps with the other component, forming the interferometer output beam. Note that beam paths 251C and 251F are parallel, and are also parallel to beam paths 231B and 231E.

In general, wedge angle x can vary as desired. As shown in FIGS. 2A and 3A, wedge angle x can be selected so that beam paths 231B, 231E, 251C, and 251 are non-parallel to the normal to output surface 219. x can be sufficiently large to reduce (e.g., eliminate) overlap of any portion of a ghost beam reflected at output surface 219 with the transmitted beam when the component beam corresponding to the transmitted beam exits DPMI 200 in the interferometer output beam. Reduced overlap of the output beam components with portions of the beam reflected spuriously from surfaces, such as output surface 319, can reduce errors (e.g., cyclic errors) in measurements made using DPMI 200.

The degree of overlap of a beam caused by reflection at the output surface and the output beam depends on wedge angle, x, the diameter of the beam, and the beam's path length from output surface 319 to a detector used to monitor the output beam. Accordingly, for relatively large diameter beams and/or interferometers having relatively short beam paths from output surface 319 to the detector, the wedge angle can be increased to reduce this overlap. In some embodiments, x can be about 0.1° or more (e.g., about 0.5° or more, about 1° or more). Typically, x is about 10° or less. In some embodiments, x is about 3°. Alternatively, in some embodiments, the wedge angle is 00.

One or more optical surfaces (i.e., surfaces of components that are in the path of one or more beams) can include an antireflection coating. For example, input surface 225 and/or output surface 219 can include an antireflection coating. An antireflection coating can reduce spurious reflections of an incident beam from the surface, thereby reducing errors (e.g., cyclic errors) in measurements made using DPMI 200.

In some embodiments, input assembly 220 is formed from a rhombic prism with PBS coatings on opposing surfaces. Right angle prisms can be bonded to the coated surfaces to provide a monolithic rectangular assembly.

Main assembly 220 can be formed by grinding or cleaving opposing corners of a rectangular or cubic block of material (e.g., glass) to provide opposing parallel surfaces onto which PBS coatings can be deposited. The size of the surfaces can be selected based on the size of the cube corner retroreflector to be used in the assembly. Pyramidal prisms can be bonded to the coated surfaces to provide a monolithic rectangular assembly onto which the retroreflector can be attached.

Main assembly 210 and input assembly 220 are bonded together and to other components so that DPMI 200 is a monolithic assembly, where the optical interfaces between adjacent components are optically coupled to each other. Optical coupling between components can be achieved using an optical adhesive or an index matching fluid. Use of birefringent films as retarders (e.g., for half wave retarder 223 and/or quarter wave plate 213) also facilitates forming a monolithic assembly since these films can be readily laminated between other components. Optical coupling of adjacent components can reduce spurious reflections from component interfaces, reducing errors (e.g., cyclic errors) in measurements made using DPMI 200.

Although DPMI 200 is a monolithic structure, in some embodiments, one or more components of a DPMI need not be optically coupled to the other components. For example, referring to FIGS. 4A, 4B, 5A, and 5B, in certain embodiments a DPMI 400 can include a discrete assembly 401 separate from a monolithic input assembly/main assembly structure. In some embodiments, assembly 401 can be used as a window in a reference cavity. Assembly 401 includes a quarter wave plate 410 (e.g., a polymeric quarter wave plate) sandwiched between an optical flat 414 and a wedge 412. The exposed surface 413 of wedge 412 is the output surface for DPMI 400 and faces mirror 240.

Exposed surface 420 of main assembly 210, exposed surface 415 of optical flat 414, and exposed surface 413 are all oriented non-orthogonal to the path of the interferometer input and output beams, thereby reducing the incidence of spurious reflections from these surfaces at the interferometer's detector. As indicated in the figures, the angle of wedge 412 is y and the angular offset of surface 420 from a surface orthogonal to the interferometer input and output beams is γ. In some embodiments, y can be about 0.1° or more (e.g., about 0.5° or more, about 1° or more). Typically, y is about 10° or less. In certain embodiments, γ is about 0.1° or more (e.g., about 0.5° or more, about 1° or more), and less than about 10°. Furthermore, one or more of surfaces 413, 415, and 420 can include an antireflection coating. The angular offset between surface 415 and surface 420 is denoted z, and can also vary. In some embodiments, z is about 0.5° or more (e.g., about 1.0° or more, about 1.5° or more, about 2° or more). Alternatively, in certain embodiments, surface 415 and surface 420 are parallel (i.e., z is 0°).

While x, y, z, and γ represent azimuthal angular displacements about a vertical axis, generally the surfaces can be oriented with angular displacements relative to other axes (e.g., a horizontal axis). In general, y, z, and/or γ can be angular displacements about parallel axes or non-parallel axes. For example, in some embodiments, y can be an angular displacement about a vertical axis, while z is a vertical displacement about a horizontal axis.

Figure 6A:
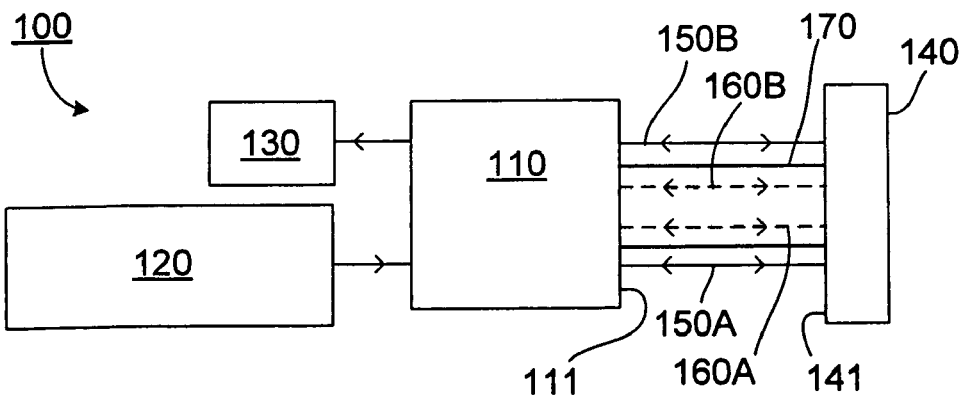
FIG. 6A is a schematic view of an interferometry system including a DPMI wherein one of the interferometer beams travels along a path through a sealed chamber.

In general, DPMIs such as those described above can be used in a variety of applications. For example, in some embodiments, DPMIs can be used in a refractometer. Referring to FIG. 6A, in some embodiments, interferometry system 100 shown in FIG. 1 can be adapted for use as a refractometer, monitoring variations in ambient refractivity. In this example, one of the two beams (i.e., the beam corresponding to beam passes 160A and 160B) can be enclosed in a chamber 170 having a controlled environment (e.g., a vacuum). When mirror 140 is mechanically fixed with respect to DPMI 110, variations in the phase of output beam 131 can be attributed to variations in the refractivity of the atmosphere in the path of beams 150A and 150B. Examples of interferometric refractometers are described in U.S. Pat. No. 6,529,279, entitled "INTERFEROMETER AND METHOD FOR MEASURING THE REFRACTIVE INDEX AND OPTICAL PATH LENGTH EFFECTS OF AIR," for example, the entire contents of which are hereby incorporated by reference.

Figure 6B:
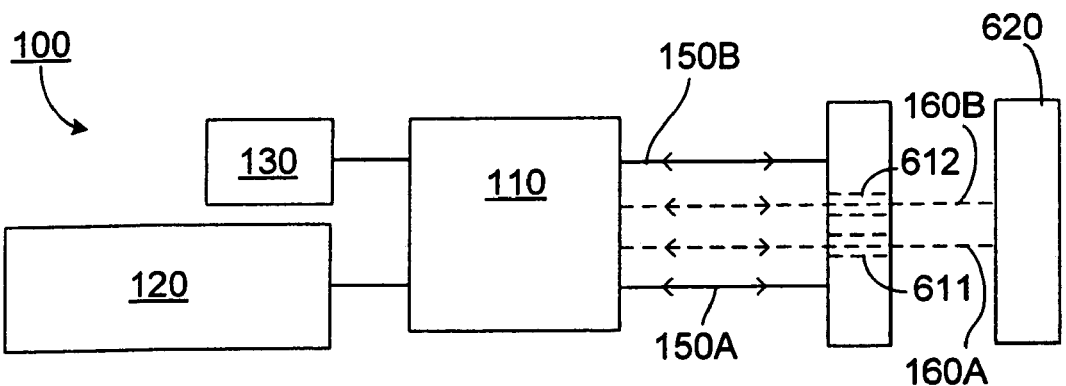
FIG. 6B is a schematic view of an interferometry system including a DPMI wherein the interferometer beams each make a double pass to a different mirror.

While the in the foregoing embodiments both interferometer beams reflect from the same mirror, in certain embodiments, the beams can reflect from different objects. For example, referring to FIG. 6B, in some embodiments, one beam directed along paths 150A and 150B can reflect from a first mirror 610, while the other beam directed along paths 660A and 660B reflect from a different mirror 620. While paths 150A, 150B, 660A, and 660B are parallel, first mirror 610 includes apertures 611 and 612 corresponding to paths 660A and 660B, respectively. Accordingly, the beam propagating along paths 660A and 660B passes through apertures 611 and 612, rather than reflecting from first mirror 610. In this configuration, the interference phase corresponds to variations in the relative position between mirror 610 and mirror 620.

In general, DPMIs can be used in other applications to monitor the variations in the displacement between two objects, such as with a column reference as described below.

The interferometry systems described above can provide measurements with reduced cyclic errors compared to other interferometry systems. Such systems can be especially useful in lithography applications used in fabricating large scale integrated circuits such as computer chips and the like. Lithography is the key technology driver for the semiconductor manufacturing industry. Overlay improvement is one of the five most difficult challenges down to and below 100 nm line widths (design rules), see for example the *Semiconductor Industry Roadmap*, p82 (1997).

Overlay depends directly on the performance, i.e. accuracy and precision, of the distance measuring interferometers used to position the wafer and reticle (or mask) stages. Since a lithography tool may produce $50-100 M/year of product, the economic value from improved performance distance measuring interferometers is substantial. Each 1% increase in yield of the lithography tool results in approximately $1 M/year economic benefit to the integrated circuit manufacturer and substantial competitive advantage to the lithography tool vendor.

The function of a lithography tool is to direct spatially patterned radiation onto a photoresist-coated wafer. The process involves determining which location of the wafer is to receive the radiation (alignment) and applying the radiation to the photoresist at that location (exposure).

To properly position the wafer, the wafer includes alignment marks on the wafer that can be measured by dedicated sensors. The measured positions of the alignment marks define the location of the wafer within the tool. This information, along with a specification of the desired patterning of the wafer surface, guides the alignment of the wafer relative to the spatially patterned radiation. Based on such information, a translatable stage supporting the photoresist-coated wafer moves the wafer such that the radiation will expose the correct location of the wafer.

During exposure, a radiation source illuminates a patterned reticle, which scatters the radiation to produce the spatially patterned radiation. The reticle is also referred to as a mask, and these terms are used interchangeably below. In the case of reduction lithography, a reduction lens collects the scattered radiation and forms a reduced image of the reticle pattern. Alternatively, in the case of proximity printing, the scattered radiation propagates a small distance (typically on the order of microns) before contacting the wafer to produce a 1:1 image of the reticle pattern. The radiation initiates photo-chemical processes in the resist that convert the radiation pattern into a latent image within the resist.

Interferometry systems are important components of the positioning mechanisms that control the position of the wafer and reticle, and register the reticle image on the wafer. If such interferometry systems include the features described above, the accuracy of distances measured by the systems increases as cyclic error contributions to the distance measurement are minimized.

In general, the lithography system, also referred to as an exposure system, typically includes an illumination system and a wafer positioning system. The illumination system includes a radiation source for providing radiation such as ultraviolet, visible, x-ray, electron, or ion radiation, and a reticle or mask for imparting the pattern to the radiation, thereby generating the spatially patterned radiation. In addition, for the case of reduction lithography, the illumination system can include a lens assembly for imaging the spatially patterned radiation onto the wafer. The imaged radiation exposes resist coated onto the wafer. The illumination system also includes a mask stage for supporting the mask and a positioning system for adjusting the position of the mask stage relative to the radiation directed through the mask. The wafer positioning system includes a wafer stage for supporting the wafer and a positioning system for adjusting the position of the wafer stage relative to the imaged radiation. Fabrication of integrated circuits can include multiple exposing steps. For a general reference on lithography, see, for example, J. R. Sheats and B. W. Smith, in *Microlithography: Science and Technology* (Marcel Dekker, Inc., New York, 1998), the contents of which is incorporated herein by reference.

Interferometers described above can be used with displacement measuring interferometry systems to precisely measure the positions of each of the wafer stage and mask stage relative to other components of the exposure system, such as the lens assembly, radiation source, or support structure. In such cases, the displacement measuring interferometry system can be attached to a stationary structure and the measurement object attached to a movable element such as one of the mask and wafer stages. Alternatively, the situation can be reversed, with the displacement measuring interferometry system attached to a movable object and the measurement object attached to a stationary object.

More generally, interferometry systems can be used to measure the position of any one component of the exposure system relative to any other component of the exposure system, in which the interferometry system is attached to, or supported by, one of the components and the measurement object is attached, or is supported by the other of the components.

Figure 7A:
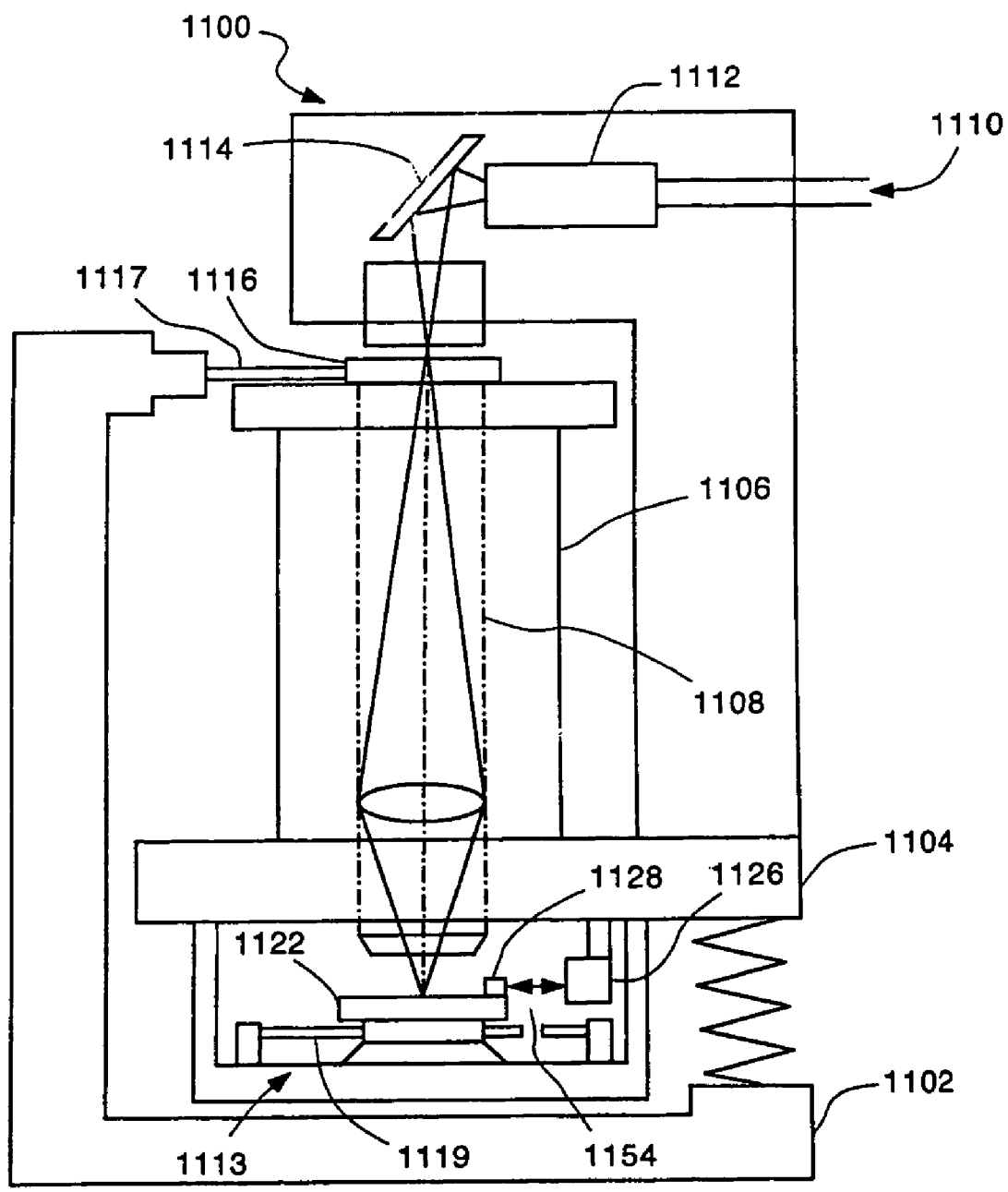
FIG. 7A is schematic diagram of a lithography system that includes an interferometry system described herein and is used to make integrated circuits.

An example of a lithography scanner 1100 using an interferometry system 1126 is shown in FIG. 7A. The interferometry system is used to precisely measure the position of a wafer (not shown) within an exposure system. Here, stage 1122 is used to position and support the wafer relative to an exposure station. Scanner 1100 includes a frame 1102, which carries other support structures and various components carried on those structures. An exposure base 1104 has mounted on top of it a lens housing 1106 atop of which is mounted a reticle or mask stage 1116, which is used to support a reticle or mask. A positioning system for positioning the mask relative to the exposure station is indicated schematically by element 1117. Positioning system 1117 can include, e.g., piezoelectric transducer elements and corresponding control electronics. Although, it is not included in this described embodiment, an interferometry system including one or more of the DPMIs described above can also be used to precisely measure the position of the mask stage as well as other moveable elements whose position must be accurately monitored in processes for fabricating lithographic structures (see supra Sheats and Smith *Microlithography: Science and Technology*).

Suspended below exposure base 1104 is a support base 1113 that carries wafer stage 1122. Stage 1122 includes a plane mirror 1128 for reflecting a measurement beam 1154 directed to the stage by interferometry system 1126. A positioning system for positioning stage 1122 relative to interferometry system 1126 is indicated schematically by element 1119. Positioning system 1119 can include, e.g., piezoelectric transducer elements and corresponding control electronics. The measurement beam reflects back to the interferometry system, which is mounted on exposure base 1104. The interferometry system can include any of the DPMI embodiments described previously.

During operation, a radiation beam 1110, e.g., an ultraviolet (UV) beam from a UV laser (not shown), passes through a beam shaping optics assembly 1112 and travels downward after reflecting from mirror 1114. Thereafter, the radiation beam passes through a mask (not shown) carried by mask stage 1116. The mask (not shown) is imaged onto a wafer (not shown) on wafer stage 1122 via a lens assembly 1108 carried in a lens housing 1106. Base 1104 and the various components supported by it are isolated from environmental vibrations by a damping system depicted by spring 1120.

In other embodiments of the lithographic scanner, an interferometry systems including one or more of the DPMIs described previously can be used to measure distance along multiple axes and angles associated for example with, but not limited to, the wafer and reticle (or mask) stages. Also, rather than a UV laser beam, other beams can be used to expose the wafer including, e.g., x-ray beams, electron beams, ion beams, and visible optical beams.

In some embodiments, the lithographic scanner can include what is known in the art as a column reference. In such embodiments, the interferometry system 1126 includes an interferometer (e.g., a DPMI) that directs the reference beam (not shown) along an external reference path that contacts a reference mirror (not shown) mounted on some structure that directs the radiation beam, e.g., lens housing 1106. The reference mirror reflects the reference beam back to the interferometry system. The interference signal produce by interferometry system 1126 when combining measurement beam 1154 reflected from stage 1122 and the reference beam reflected from a reference mirror mounted on the lens housing 1106 indicates changes in the position of the stage relative to the radiation beam. Furthermore, in other embodiments the interferometry system 1126 can be positioned to measure changes in the position of reticle (or mask) stage 1116 or other movable components of the scanner system. Finally, the interferometry systems can be used in a similar fashion with lithography systems involving steppers, in addition to, or rather than, scanners.

Figure 7B:
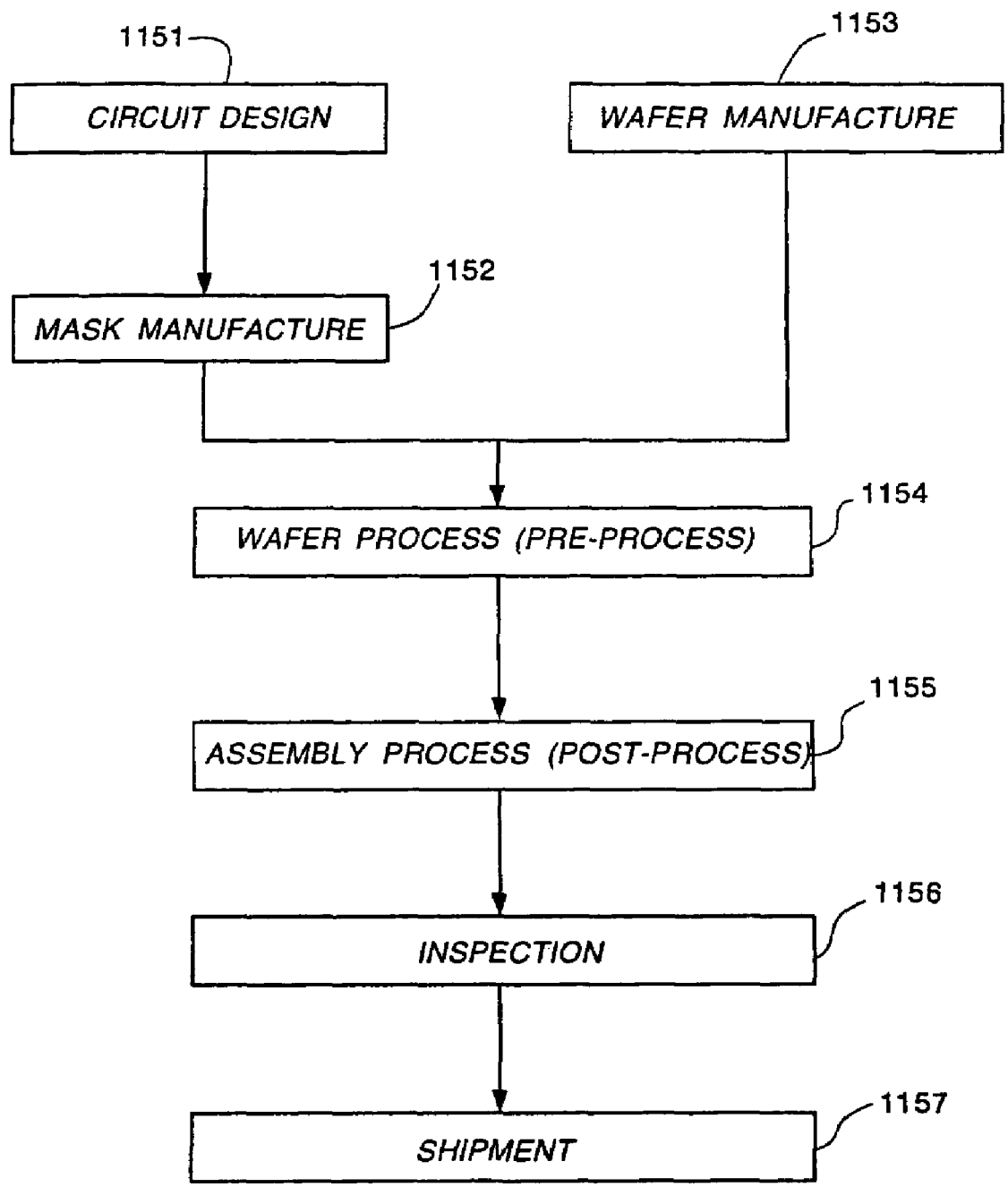
FIGS. 7B-7C are flow charts that described steps for making integrated circuits.

As is well known in the art, lithography is a critical part of manufacturing methods for making semiconducting devices. For example, U.S. Pat. No. 5,483,343 outlines steps for such manufacturing methods. These steps are described below with reference to FIGS. 7B and 7C. FIG. 7B is a flow chart of the sequence of manufacturing a semiconductor device such as a semiconductor chip (e.g. IC or LSI), a liquid crystal panel or a CCD. Step 1151 is a design process for designing the circuit of a semiconductor device. Step 1152 is a process for manufacturing a mask on the basis of the circuit pattern design. Step 1153 is a process for manufacturing a wafer by using a material such as silicon.

Step 1154 is a wafer process which is called a pre-process wherein, by using the so prepared mask and wafer, circuits are formed on the wafer through lithography. To form circuits on the wafer that correspond with sufficient spatial resolution those patterns on the mask, interferometric positioning of the lithography tool relative the wafer is necessary. The interferometry methods and systems described herein can be especially useful to improve the effectiveness of the lithography used in the wafer process.

Step 1155 is an assembling step, which is called a post-process wherein the wafer processed by step 1154 is formed into semiconductor chips. This step includes assembling (dicing and bonding) and packaging (chip sealing). Step 1156 is an inspection step wherein operability check, durability check and so on of the semiconductor devices produced by step 1155 are carried out. With these processes, semiconductor devices are finished and they are shipped (step 1157).

Figure 7C:
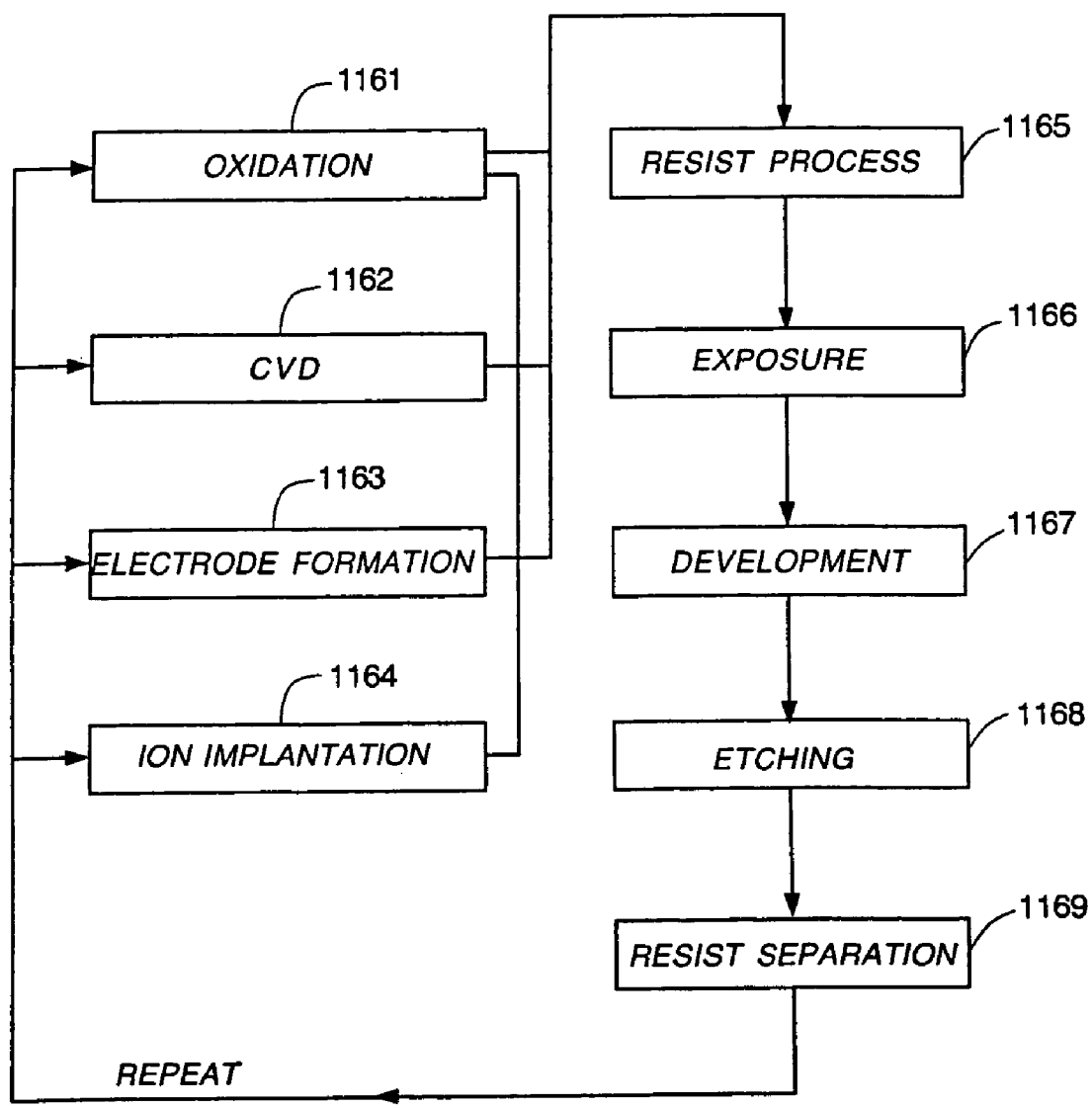

FIG. 7C is a flow chart showing details of the wafer process. Step 1161 is an oxidation process for oxidizing the surface of a wafer. Step 1162 is a CVD process for forming an insulating film on the wafer surface. Step 1163 is an electrode forming process for forming electrodes on the wafer by vapor deposition. Step 1164 is an ion implanting process for implanting ions to the wafer. Step 1165 is a resist process for applying a resist (photosensitive material) to the wafer. Step 1166 is an exposure process for printing, by exposure (i.e., lithography), the circuit pattern of the mask on the wafer through the exposure apparatus described above. Once again, as described above, the use of the interferometry systems and methods described herein improve the accuracy and resolution of such lithography steps.

Step 1167 is a developing process for developing the exposed wafer. Step 1168 is an etching process for removing portions other than the developed resist image. Step 1169 is a resist separation process for separating the resist material remaining on the wafer after being subjected to the etching process. By repeating these processes, circuit patterns are formed and superimposed on the wafer.

Interferometry systems described above can also be used in other applications in which the relative position of an object needs to be measured precisely. For example, in applications in which a write beam such as a laser, x-ray, ion, or electron beam, marks a pattern onto a substrate as either the substrate or beam moves, the interferometry systems can be used to measure the relative movement between the substrate and write beam.

Figure 8:
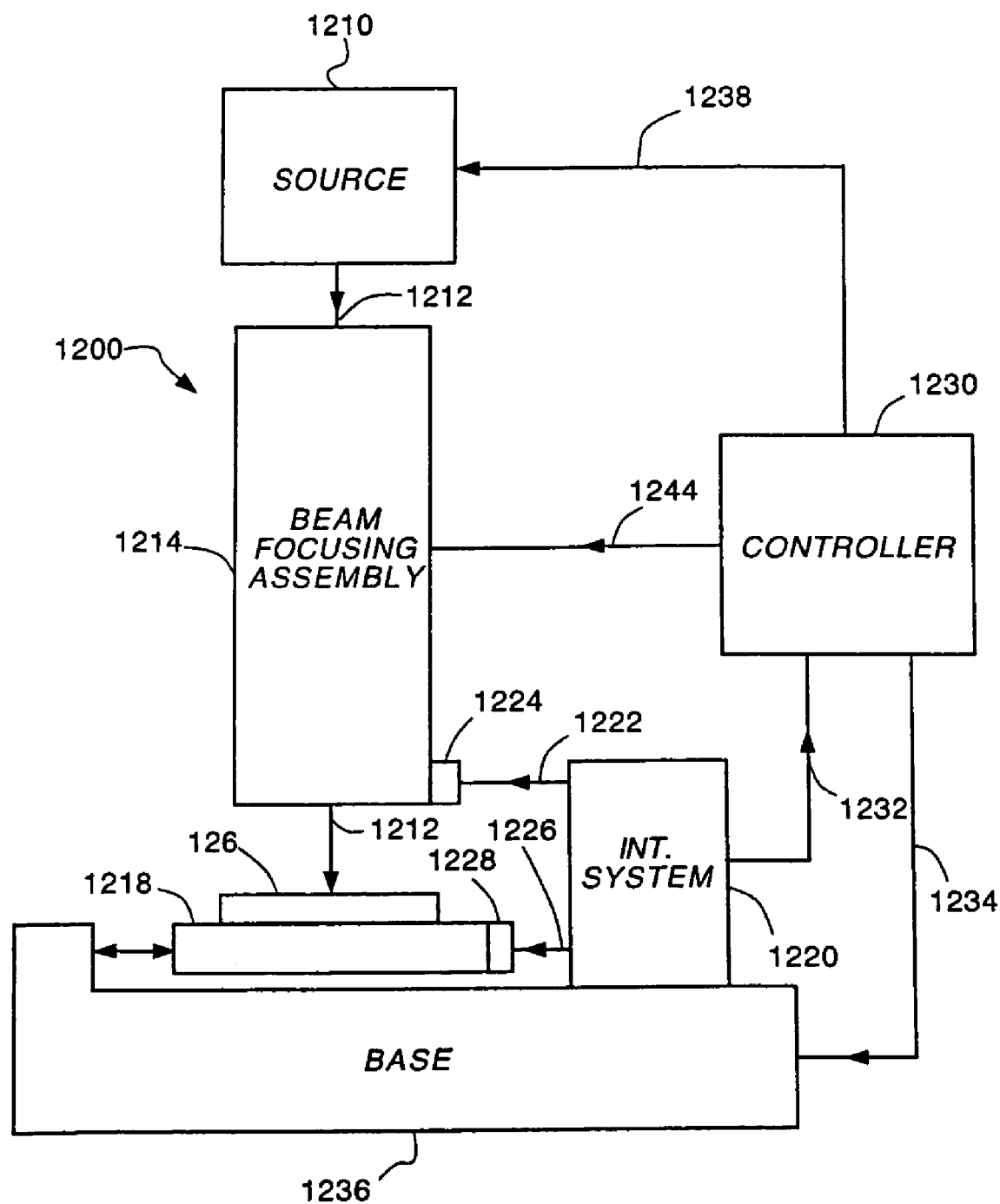
FIG. 8 is a schematic of a beam writing system that includes an interferometry system described herein.

As an example, a schematic of a beam writing system 1200 is shown in FIG. 8. A source 1210 generates a write beam 1212, and a beam focusing assembly 1214 directs the radiation beam to a substrate 1216 supported by a movable stage 1218. To determine the relative position of the stage, a displacement measuring interferometry system 1220 directs a reference beam 1222 to a mirror 1224 mounted on beam focusing assembly 1214 and a measurement beam 1226 to a mirror 1228 mounted on stage 1218. Since the reference beam contacts a mirror mounted on the beam focusing assembly, the beam writing system is an example of a system that uses a column reference. Interferometry system 1220 can include any of the interferometry systems described previously (e.g., used as a refractometer to measure changes in the refractive index of the atmosphere proximate to a measurement beam path of a displacement measuring interferometer of interferometry system 1220). Changes in the position measured by the interferometry system correspond to changes in the relative position of write beam 1212 on substrate 1216. Interferometry system 1220 sends a measurement signal 1232 to controller 1230 that is indicative of the relative position of write beam 1212 on substrate 1216. Controller 1230 sends an output signal 1234 to a base 1236 that supports and positions stage 1218. In addition, controller 1230 sends a signal 1238 to source 1210 to vary the intensity of, or block, write beam 1212 so that the write beam contacts the substrate with an intensity sufficient to cause photophysical or photochemical change only at selected positions of the substrate.

Furthermore, in some embodiments, controller 1230 can cause beam focusing assembly 1214 to scan the write beam over a region of the substrate, e.g., using signal 1244. As a result, controller 1230 directs the other components of the system to pattern the substrate. The patterning is typically based on an electronic design pattern stored in the controller. In some applications the write beam patterns a resist coated on the substrate and in other applications the write beam directly patterns, e.g., etches, the substrate.

An important application of such a system is the fabrication of masks and reticles used in the lithography methods described previously. For example, to fabricate a lithography mask an electron beam can be used to pattern a chromium-coated glass substrate. In such cases where the write beam is an electron beam, the beam writing system encloses the electron beam path in a vacuum. Also, in cases where the write beam is, e.g., an electron or ion beam, the beam focusing assembly includes electric field generators such as quadrapole lenses for focusing and directing the charged particles onto the substrate under vacuum. In other cases where the write beam is a radiation beam, e.g., x-ray, UV, or visible radiation, the beam focusing assembly includes corresponding optics and for focusing and directing the radiation to the substrate.

A number of embodiments of the invention have been described. Nevertheless, it will be understood that various modifications may be made without departing from the spirit and scope of the invention. Accordingly, other embodiments are within the scope of the following claims.

What is claimed is:

1. An apparatus comprising:
an interferometer comprising a main assembly comprising two laterally displaced polarizing beam splitter interfaces, wherein the interfaces are positioned to receive two spatially separated beams and direct them each to make at least two passes to one or more remote objects,
wherein each interface reflects and transmits each beam at least once, and the interferometer is configured to combine the two beams after they make the at least two passes to the one or more remote objects to produce an output beam comprising information about an optical path length difference between paths traveled by the two beams; and
an input assembly configured to derive the spatially separated beams from an input beam and to direct the spatially separated beams towards the main assembly.

2. The apparatus of claim 1, wherein the input assembly is configured so that the spatially separated beams have orthogonal polarizations when exiting the input assembly.

3. The apparatus of claim 1, further comprising a wave plate between the input assembly and the main assembly, the wave plate being configured to rotate the polarization of one of the spatially separated beams as it travels between the input assembly and the main assembly.

4. The apparatus of claim 3, wherein the wave plate is a polymeric wave plate.

5. The apparatus of claim 1, wherein an output surface of the input assembly is optically coupled to an input surface of the main assembly.

6. The apparatus of claim 1, wherein the input assembly is configured to direct the two beams towards the main assembly along parallel paths.

7. The apparatus of claim 1, wherein the input assembly comprises two laterally displaced polarizing beam splitter interfaces.

8. The apparatus of claim 7, wherein the two laterally displaced polarizing beam splitter interfaces of the input assembly are parallel.

9. The apparatus of claim 7, wherein the two laterally displaced polarizing beam splitter interfaces of the input assembly are non-parallel to the two laterally displaced polarizing beam splitter interfaces of the main assembly.

10. The apparatus of claim 1, wherein the interferometer is configured so that the two spatially separated beams have the same polarization when they are received by the main assembly.

11. The apparatus of claim 1, wherein the main assembly is configured to direct the spatially separated beams to make at least two passes along parallel paths to the one or more remote objects.

12. The apparatus of claim 1, further comprising a retroreflector configured to direct the spatially separated beams back towards the main assembly after each beam makes its first pass to the one or more remote objects.

13. The apparatus of claim 1, wherein the interferometer is configured so that each of the spatially separated beams makes at least two passes to different locations on the one or more remote objects.

14. The apparatus of claim 1, wherein the laterally displaced polarizing beam splitter interfaces are parallel.

15. The apparatus of claim 1, wherein the main assembly is monolithic.

16. The apparatus of claim 1, further comprising an output surface configured so that the spatially separated beams intersect the output surface with a non-perpindicular angle of incidence at least once.

17. The apparatus of claim 16, wherein the angle of incidence of the beams at the output surface is about 0.1° or more.

18. The apparatus of claim 16, wherein the angle of incidence of the beams at the output surface is about 10° or less.

19. The apparatus of claim 16, wherein the output assembly comprises a wedge.

20. The apparatus of claim 16, further comprising a quarter wave plate positioned between the main assembly and the output assembly.

21. The apparatus of claim 20, wherein the quarter wave plate is a polymeric quarter wave plate.

22. The apparatus of claim 16, wherein the output assembly is optically coupled to the main assembly.

23. The apparatus of claim 1, further comprising a detector positioned to receive the output beam.

24. The apparatus of claim 1, further comprising a source configured to provide an input beam from which the interferometer derives the spatially separated beams.

25. The apparatus of claim 1, wherein the one or more remote objects comprises of a reflecting element.

26. The apparatus of claim 25, wherein the reflecting element is a plane mirror.

27. The apparatus of claim 25, wherein the reflecting element is a retroreflector.

28. A refractometer comprising the apparatus of claim 1.

29. A lithography system for use in fabricating integrated circuits on a wafer, the system comprising:
a stage for supporting the wafer;
an illumination system for imaging spatially patterned radiation onto the wafer;

a positioning system for adjusting the position of the stage relative to the imaged radiation; and an interferometry system comprising the apparatus of claim 1, the interferometry system being configured to monitor the position of the wafer relative to the imaged radiation.

30. A lithography system for use in fabricating integrated circuits on a wafer, the system comprising:

a stage for supporting the wafer; and an illumination system including a radiation source, a mask, a positioning system, a lens assembly, and an interferometry system comprising the apparatus of claim 1, wherein during operation the source directs radiation through the mask to produce spatially patterned radiation, the positioning system adjusts the position of the mask relative to the radiation from the source, the lens assembly images the spatially patterned radiation onto the wafer, and the interferometry system monitors the position of the mask relative to the radiation from the source.

31. A beam writing system for use in fabricating a lithography mask, the system comprising:

a source providing a write beam to pattern a substrate;

a stage supporting the substrate;

a beam directing assembly for delivering the write beam to the substrate;

a positioning system for positioning the stage and beam directing assembly relative one another; and an interferometry system comprising the apparatus of claim 1, the interferometry system being configured to monitor the position of the stage relative to the beam directing assembly.

32. A method for fabricating integrated circuits, the method comprising using the lithography system of claim 31.

33. A lithography method for use in fabricating integrated circuits on a wafer, the method comprising:

supporting the wafer on a moveable stage;

imaging spatially patterned radiation onto the wafer;

adjusting the position of the stage; and monitoring the position of the stage using an interferometry system comprising the apparatus of claim 1.

34. A method for fabricating integrated circuits, the method comprising the lithography method of claim 33.

35. A method for fabricating integrated circuits, the method comprising using the lithography system of claim 33.

36. A lithography method for use in the fabrication of integrated circuits comprising:

directing input radiation through a mask to produce spatially patterned radiation;

positioning the mask relative to the input radiation;

monitoring the position of the mask relative to the input radiation using an interferometry system comprising the apparatus of claim 1; and imaging the spatially patterned radiation onto a wafer.

37. A method for fabricating integrated circuits, the method comprising the lithography method of claim 36.

38. A lithography method for fabricating integrated circuits on a wafer comprising:

positioning a first component of a lithography system relative to a second component of a lithography system to expose the wafer to spatially patterned radiation; and monitoring the position of the first component relative to the second component using an interferometry system comprising the apparatus of claim 1.

39. A method for fabricating integrated circuits, the method comprising the lithography method of claim 38.

40. A method for fabricating a lithography mask, the method comprising:

directing a write beam to a substrate to pattern the substrate;

positioning the substrate relative to the write beam; and monitoring the position of the substrate relative to the write beam using an interferometry system comprising the apparatus of claim 1.

41. An interferometer, comprising:

an input assembly comprising two laterally displaced polarizing beam splitter interfaces; and a main assembly comprising at least one polarizing beam splitter interface, wherein the interfaces in the input assembly are positioned to derive two spatially separated beams from an input beam, the main assembly directs the spatially separated beams each to make at least two passes to one or more remote objects, and the input assembly combines the two beams after they make the at least two passes to the one or more remote objects to produce an output beam comprising information about an optical path length difference between paths traveled the two beams.

42. The interferometer of claim 41, wherein the two laterally displaced polarizing beam splitter interfaces in the input assembly are parallel.

43. The interferometer of claim 42, wherein the main assembly comprises two polarizing beam splitter interfaces that are non-parallel to the two laterally displaced polarizing beam splitter interfaces in the input assembly.

44. The interferometer of claim 41, further comprising a wave plate between the input assembly and the main assembly, the wave plate being configured to rotate the polarization of one of the spatially separated beams as it travels between the input assembly and the main assembly.

45. The interferometer of claim 41, wherein the main assembly is configured to direct the spatially separated beams to make at least two passes to the one or more remote objects along parallel paths.

46. The interferometer of claim 45, wherein the one or more remote objects is a plane mirror.

47. The interferometer of claim 41, wherein the main assembly is monolithic.

48. The interferometer of claim 41, further comprising an output surface configured so that the spatially separated beams intersect the output surface with a non-perpendicular angle of incidence at least once.

49. The interferometer of claim 48, wherein the output surface is the nearest surface of the interferometer to the one or more remote objects.

50. A lithography system for use in fabricating integrated circuits on a wafer, the system comprising:

a stage for supporting the wafer;

an illumination system for imaging spatially patterned radiation onto the wafer;

a positioning system for adjusting the position of the stage relative to the imaged radiation; and an interferometry system comprising the interferometer of claim 41, the interferometry system being configured to monitor the position of the wafer relative to the imaged radiation.

51. A method, comprising:
using an input assembly of an interferometer to derive two spatially separated beams from an input beam and to direct the spatially separated beams towards a main assembly of the interferometer;
using the main assembly to direct two spatially separated beams to each make at least two passes to one or more remote objects, wherein the main assembly comprises two laterally displaced polarizing beam splitter interfaces positioned to receive the two beams and each interface reflects and transmits each beam at least once; and
combining the two beams after they make the at least two passes to the one or more remote objects to produce an output beam comprising information about an optical path length difference between the two beams.

* * * * *